United States Patent
Hirai et al.

(10) Patent No.: US 10,165,706 B2
(45) Date of Patent: Dec. 25, 2018

(54) LIQUID IMMERSION BATH AND LIQUID IMMERSION COOLING APPARATUS

(71) Applicant: FUJITSU LIMITED, Kawasaki-shi, Kanagawa (JP)

(72) Inventors: Keita Hirai, Kawasaki (JP); Tsuyoshi So, Kawasaki (JP); Naofumi Kosugi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/602,280

(22) Filed: May 23, 2017

(65) Prior Publication Data
US 2018/0063991 A1    Mar. 1, 2018

(30) Foreign Application Priority Data
Sep. 1, 2016   (JP) .................. 2016-170508

(51) Int. Cl.
*H05K 7/20* (2006.01)
*F28F 9/02* (2006.01)

(52) U.S. Cl.
CPC ....... *H05K 7/20236* (2013.01); *F28F 9/0239* (2013.01); *H05K 7/20263* (2013.01); *H05K 7/20272* (2013.01); *H05K 7/20772* (2013.01)

(58) Field of Classification Search
CPC ... H01L 23/473; G06F 1/20; G06F 2200/201; G06F 1/206; H05K 7/20236; H05K 7/20772; H05K 7/20809; H05K 7/203; H05K 7/20781; H05K 7/20927; H05K 7/2079; H05K 7/20836; H05K 7/20254; H05K 5/067; H05K 7/20263; H05K 7/20272; F28F 9/26; F28F 9/0239
See application file for complete search history.

(56) References Cited

U.S. PATENT DOCUMENTS

| | | | | |
|---|---|---|---|---|
| 3,381,709 | A * | 5/1968 | Pregno | B60K 15/077 137/578 |
| 3,631,880 | A * | 1/1972 | Hansel | F04B 53/1037 137/172 |
| 4,765,397 | A * | 8/1988 | Chrysler | H01L 23/473 165/104.33 |
| 5,030,342 | A * | 7/1991 | Ortega | E02B 15/106 210/122 |
| 7,650,902 | B1 * | 1/2010 | Tilton | B01D 17/02 137/172 |
| 8,475,656 | B1 * | 7/2013 | Neumann | E04H 4/1263 210/167.1 |

(Continued)

FOREIGN PATENT DOCUMENTS

| | | | | |
|---|---|---|---|---|
| CN | 205388381 U | * | 7/2016 | ............... F24H 9/16 |
| WO | WO 2016/088280 A1 | | 6/2016 | |

*Primary Examiner* — Adam B Dravininkas
(74) *Attorney, Agent, or Firm* — Fujitsu Patent Center

(57) ABSTRACT

A liquid immersion bath includes: a liquid immersion bath main body in which liquid coolant and an electronic device to be immersed in the coolant are placed; a coolant inlet and a coolant outlet provided to the liquid immersion bath main body; a coolant discharge port which floats on a liquid surface of the liquid coolant in the liquid immersion bath main body; and a hose which couples the coolant outlet and the coolant discharge port and bends in accordance with a movement of the coolant discharge port due to variation in a height of the liquid surface.

14 Claims, 8 Drawing Sheets

(56) References Cited

U.S. PATENT DOCUMENTS

| | | | | |
|---|---|---|---|---|
| 2004/0221604 A1* | 11/2004 | Ota | ................... | H05K 7/20781 |
| | | | | 62/259.2 |
| 2014/0362527 A1* | 12/2014 | Best | ......................... | G06F 1/20 |
| | | | | 361/679.53 |
| 2015/0146368 A1* | 5/2015 | Shafer | ............... | H05K 7/20236 |
| | | | | 361/679.53 |
| 2017/0156233 A1* | 6/2017 | Moss | ................ | H05K 7/20818 |

* cited by examiner

LIQUID IMMERSION BATH AND LIQUID IMMERSION COOLING APPARATUS

CROSS-REFERENCE TO RELATED APPLICATION

This application is based upon and claims the benefit of priority of the prior Japanese Patent Application No. 2016-170508, filed on Sep. 1, 2016, the entire contents of which are incorporated herein by reference.

FIELD

The embodiments discussed herein are related to a liquid immersion bath and a liquid immersion cooling apparatus.

BACKGROUND

In a data center, electronic devices such as servers and storages are mounted with a high density.

Related art is disclosed in International Publication Pamphlet No. WO 2016/088280.

SUMMARY

According to an aspect of the embodiments, a liquid immersion bath includes: a liquid immersion bath main body in which liquid coolant and an electronic device to be immersed in the coolant are placed; a coolant inlet and a coolant outlet provided to the liquid immersion bath main body; a coolant discharge port which floats on a liquid surface of the liquid coolant in the liquid immersion bath main body; and a hose which couples the coolant outlet and the coolant discharge port and bends in accordance with a movement of the coolant discharge port due to variation in a height of the liquid surface.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

As the performance of electronic devices improves, the amount of heat generated from the electronic devices increases.

For example, if electronic devices which generate a large amount of heat are mounted with a high density, the temperature of the electronic devices exceeds an allowable upper limit temperature. This may cause a malfunction or a fault. For this reason, a cooling method may be provided which enables sufficient cooling even when electronic devices which generate a large amount of heat are mounted with a high density.

For example, an electronic device is immersed in a liquid coolant and then is cooled down. The electronic device is immersed in the coolant poured into a liquid immersion bath, and the coolant is circulated between the liquid immersion bath and a heat exchanger. Used as the coolant is, for example, a liquid with a high insulating property such as a fluorocarbon compound.

Heat generated from the electronic device is conducted to the heat exchanger through the coolant, and is discharged from the heat exchanger to the outside. On the other hand, the coolant, the temperature of which is decreased after passing through the heat exchanger, is returned to the liquid immersion bath.

The coolant in the liquid immersion bath rises up when warmed by the electronic device. For this reason, a coolant discharge port of the liquid immersion bath is disposed in the vicinity of a liquid surface of the coolant (slightly below the liquid surface) in order to efficiently conduct the heat discharged from the electronic device to the heat exchanger. The number of electronic devices immersed in the liquid immersion bath varies due to, for example, expansion and downscaling of equipment, or the maintenance of the electronic devices. Thus, a liquid surface height of the coolant in the liquid immersion bath may change. When the liquid surface height of the coolant in the liquid immersion bath changes, there may be a case where high-temperature coolant near the liquid surface is not transferred to the heat exchanger, resulting in a reduction in efficiency of cooling the electronic device.

For example, a liquid immersion bath and a liquid immersion cooling apparatus may be provided which are capable of avoiding a reduction in cooling efficiency even when the liquid surface height of the coolant changes.

Figure 1:
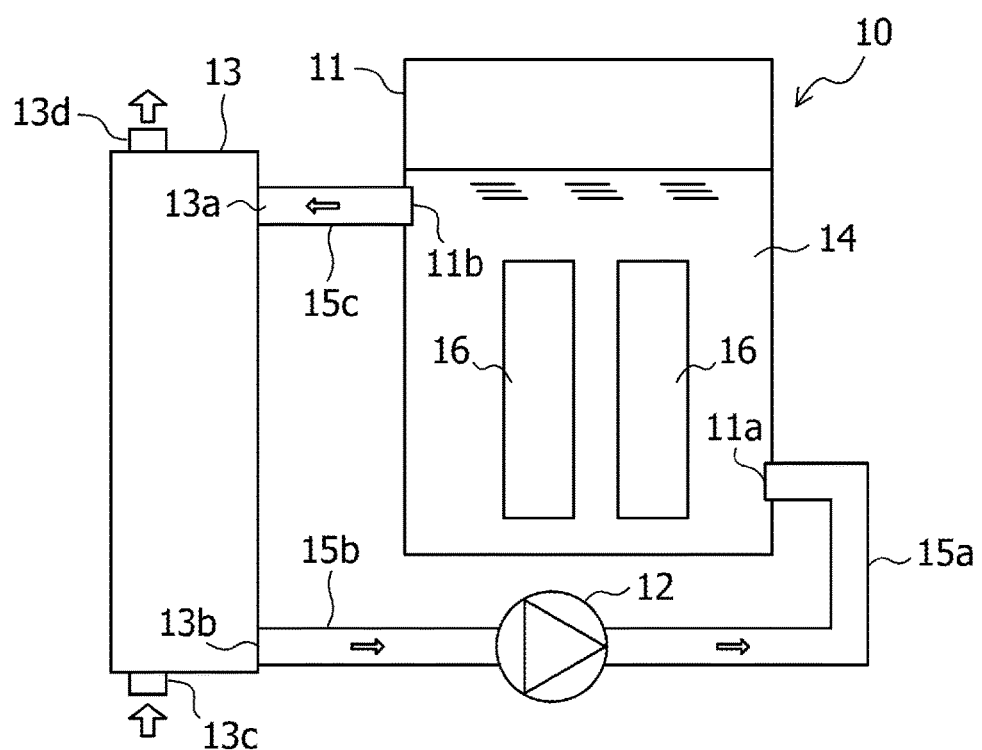
FIG. 1 illustrates an example of a liquid immersion cooling apparatus.

FIG. 1 illustrates an example of the liquid immersion cooling apparatus.

A liquid immersion cooling apparatus 10 illustrated in FIG. 1 includes a liquid immersion bath 11, a pump 12, and a heat exchanger 13. Liquid coolant 14 is poured into the liquid immersion bath 11, and electronic devices 16 are immersed in the coolant 14. A coolant inlet 11a is provided on the lower side of the liquid immersion bath 11, and a coolant outlet 11b is provided at a position slightly lower than the liquid surface.

The coolant inlet 11a of the liquid immersion bath 11 is connected to a delivery port (delivery) of the pump 12 via a pipe 15a, and a suction port (suction) of the pump 12 is connected to a coolant outlet 13b of the heat exchanger 13 via a pipe 15b. The coolant outlet 11b of the liquid immersion bath 11 is connected to a coolant inlet 13a of the heat exchanger 13 via a pipe 15c.

Provided to the heat exchanger 13 are: a coolant flow path which is connected between the coolant inlet 13a and the coolant outlet 13b; a cooling water inlet 13c through which cooling water is supplied; and a cooling water outlet 13d through which the cooling water is discharged.

Operation of the pump 12 of such a liquid immersion cooling apparatus 10 circulates the coolant 14 between the liquid immersion bath 11 and the heat exchanger 13. Since the coolant inlet 11a and the coolant outlet 11b of the liquid immersion bath 11 are located on the lower side and the upper side, respectively, the coolant 14 flows from the lower side to the upper side in the liquid immersion bath 11.

Heat generated from the electronic devices 16 while in operation warms the coolant 14 around the electronic devices 16. The warmed coolant 14 rises up in the liquid immersion bath 11, passes from the coolant outlet 11b through the pipe 15c, and is transferred to the heat exchanger 13.

In the heat exchanger 13, the cooling water supplied from the cooling water inlet 13c cools the coolant 14 passing through the coolant flow path. The coolant 14, the temperature of which is decreased after passing through the heat exchanger 13, is returned from the coolant inlet 13a to the inside of the liquid immersion bath 11 by passing from the coolant outlet 13b through the pipe 15b, the pump 12, and the pipe 15a.

The number of electronic devices 16 in the liquid immersion bath 11 changes due to, for example, expansion and downscaling of equipment, or the maintenance of the electronic devices 16.

Figures 2A, 2B:
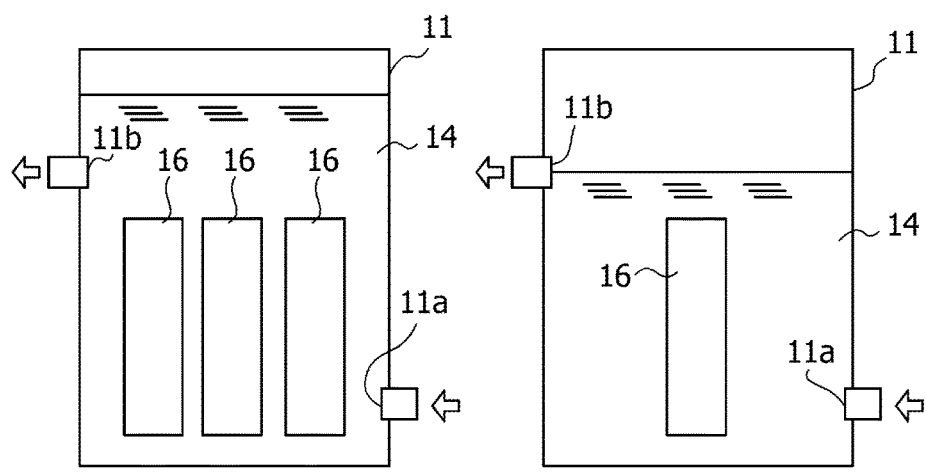
FIGS. 2A and 2B illustrate examples of a liquid surface of a coolant.

FIGS. 2A and 2B illustrate examples of the liquid surface of the coolant. FIG. 2A illustrates a situation where a position of the liquid surface of the coolant is high due to the increase in the number of electronic devices in the liquid immersion bath. FIG. 2B illustrates a situation where the position of the liquid surface of the coolant is low due to the decrease in the number of electronic devices in the liquid immersion bath. When the number of electronic devices 16 in the liquid immersion bath 11 is increased, the position of the liquid surface of the coolant 14 in the liquid immersion bath 11 is elevated as illustrated in FIG. 2A, for example. For example, since a specific gravity of the coolant 14 becomes low as the temperature increases, the nearer the liquid surface, the higher the temperature of the coolant 14. For this reason, when the height of the liquid surface of the coolant 14 is elevated as illustrated in FIG. 2A, the temperature of the coolant 14 near the coolant outlet 11b of the liquid immersion bath 11 is lower than the temperature of the coolant 14 near the liquid surface. As a result, the temperature of the coolant 14 to be transferred to the heat exchanger 13 is decreased.

When the number of electronic devices 16 in the liquid immersion bath 11 is decreased, the position of the liquid surface of the coolant 14 in the liquid immersion bath 11 is lowered as illustrated in FIG. 2B, for example. This may cause a problem that the coolant outlet 11b is exposed to the air and air is mixed in the coolant 14 to be transferred to the heat exchanger 13.

In both cases, heat exchange efficiency of the heat exchanger 13 may be reduced, leading to a reduction in efficiency of cooling the electronic devices 16.

For example, a liquid immersion cooling apparatus may be provided which lowers the possibility of reduction in cooling efficiency even when the liquid surface height of the coolant changes.

Figure 3:
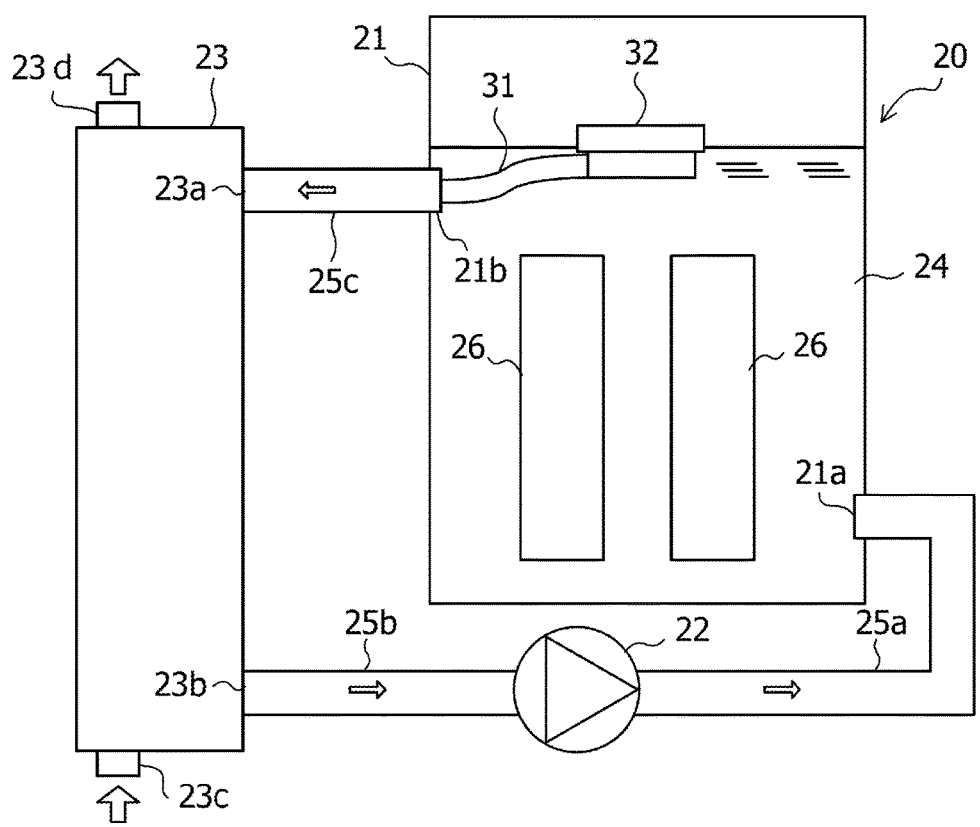
FIG. 3 illustrates an example of the liquid immersion cooling apparatus.

FIG. 3 illustrates an example of the liquid immersion cooling apparatus.

A liquid immersion cooling apparatus 20 includes a liquid immersion bath (liquid immersion bath main body) 21, a pump 22, and the heat exchanger 23.

Liquid coolant 24 is poured into the liquid immersion bath 21, and electronic devices 26 are immersed in the coolant 24. A coolant inlet 21a is provided on the lower side of the liquid immersion bath 21, and a coolant outlet 21b is provided on the upper side thereof. For example, a fluorocarbon compound may be used as the coolant 24.

The coolant inlet 21a of the liquid immersion bath 21 is connected to a delivery port (delivery) of the pump 22 via a pipe 25a, and a suction port (suction) of the pump 22 is connected to a coolant outlet 23b of the heat exchanger 23 via a pipe 25b. The coolant outlet 21b of the liquid immersion bath 21 is connected to a coolant inlet 23a of the heat exchanger 23 via a pipe 25c.

Provided to the heat exchanger 23 are: a coolant flow path which is connected between the coolant inlet 23a and the coolant outlet 23b; a cooling water inlet 23c through which cooling water is supplied; and a cooling water outlet 23d through which the cooling water is discharged.

As illustrated in FIG. 3, a hose 31 which has high flexibility and bends easily is connected to the coolant outlet 21b of the liquid immersion bath 21. A tip end of this hose 31 is connected to a coolant discharge port 32 floating on the liquid surface of the coolant 24. For example, a bellows hose may be used as the hose 31 which has high flexibility and bends easily.

Figure 4:
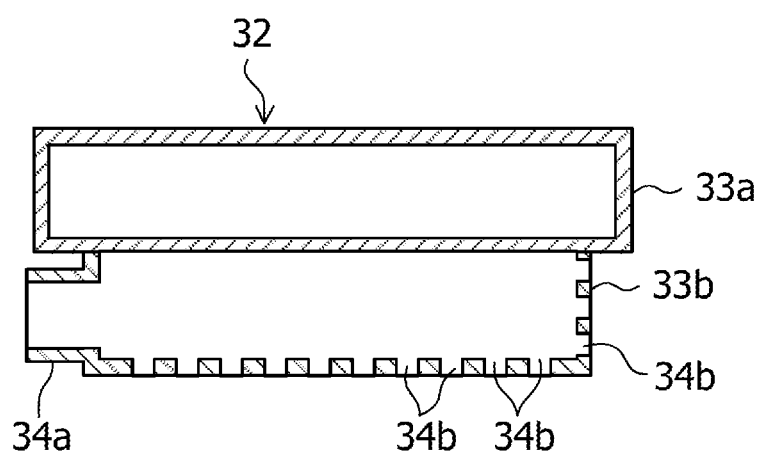
FIG. 4 illustrates an example of a cross-section of a coolant discharge port.

FIG. 4 illustrates an example of a cross-section of the coolant discharge port. As illustrated in FIG. 4, the coolant discharge port 32 includes a float 33a and a suction port part 33b disposed under the float 33a.

The float 33a may be any member which floats on the coolant 24. For example, a hollow-shaped member made of stainless steel may be used. The float 33a may be made of a resin such as a polyamide or a polycarbonate.

As illustrated in FIG. 4, the suction port part 33b is disposed under the float 33a, and includes a hose connection portion 34a to which the hose 31 is connected. Multiple holes 34b for taking in the coolant 24 are provided in a lateral surface and a bottom surface of the suction port part 33b. The float 33a and the suction port part 33b may be integrally formed, or may be separably connected to each other.

Operation of the pump 22 of such a liquid immersion cooling apparatus 20 circulates the coolant 24 between the liquid immersion bath 21 and the heat exchanger 23. For example, the suction port part 33b serves as the suction port, and the coolant 24 in the liquid immersion bath 21 is transferred from the suction port part 33b to the heat exchanger 23 by passing through the hose 31 and the pipe 25c. The coolant 24 is cooled by the cooling water while passing through the coolant flow path in the heat exchanger 23. After that, the coolant 24 is returned from the coolant inlet 21a to the inside of the liquid immersion bath 21 by passing through the pump 22 and the pipe 25a.

Figure 5A:
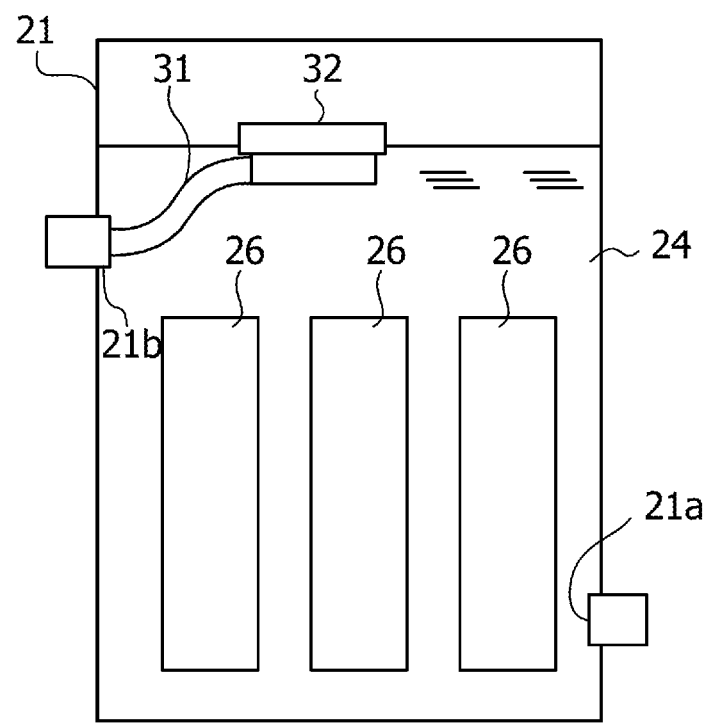
FIGS. 5A and 5B illustrate examples of the liquid surface of the coolant.
Figure 5B:
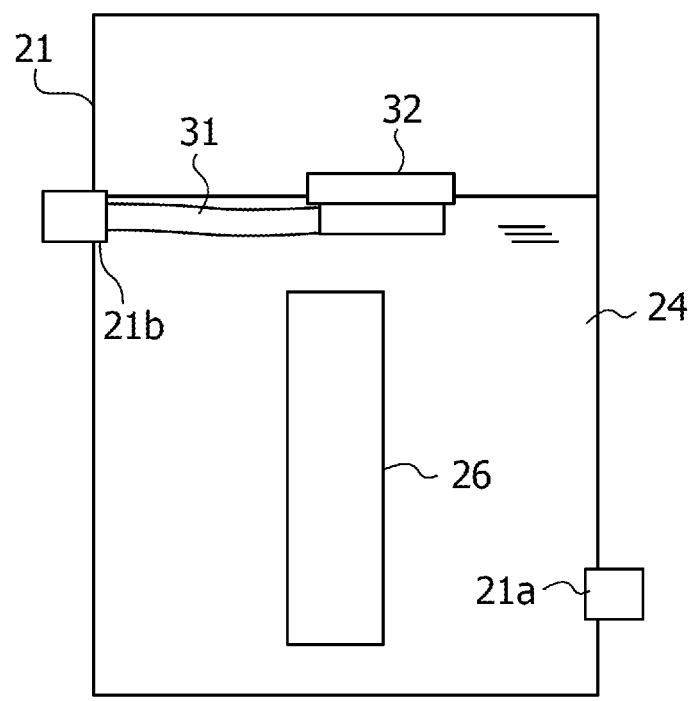

FIGS. 5A and 5B illustrate examples of the liquid surface of the coolant. FIG. 5A illustrates a situation where a position of the liquid surface of the coolant 24 is high due to the increase in the number of the electronic devices 26 in the liquid immersion bath 21. FIG. 5B illustrates a situation where the position of the liquid surface of the coolant 24 is low due to the decrease in the number of the electronic devices 26 in the liquid immersion bath 21. For example, the coolant discharge port 32 floating on the liquid surface of the coolant 24 is provided, and the hose 31 which has high flexibility is connected between the coolant outlet 21b of the liquid immersion bath 21 and the coolant discharge port 32.

For this reason, as the liquid surface of the coolant 24 moves up and down, a position of the coolant discharge port 32 also moves up and down. When the coolant discharge port 32 moves in an up-down direction, hose 31 bends easily. High-temperature coolant 24 near the liquid surface is sucked by the coolant discharge port 32, and is transferred to the heat exchanger 23.

For example, the high-temperature coolant 24 near the liquid surface is transferred to the heat exchanger 23 even when the liquid surface height of the coolant changes. This lowers the possibility of reduction in liquid cooling heat exchange efficiency of the heat exchanger 23, and thus the electronic devices 26 may be cooled efficiently regardless of the number of electronic devices 26 disposed in the liquid immersion bath 21.

Since the coolant such as a fluorocarbon compound used for the liquid immersion cooling apparatus has a relatively low heat conductivity, the coolant warmed by the electronic devices stays above the electronic devices because heat has difficulty dissipating in a horizontal direction. For this reason, the coolant discharge port 32 may be disposed immediately above the electronic devices in order to even further improve the cooling efficiency of the liquid immersion cooling apparatus.

For example, the coolant discharge port 32 may be disposed immediately above the electronic devices even when the position of the liquid surface of the coolant moves up and down.

Figure 6A:
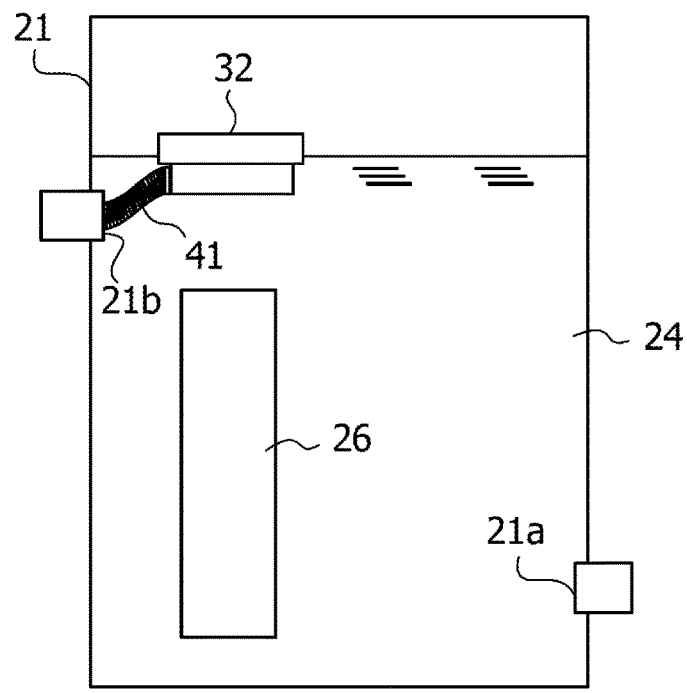
FIGS. 6A and 6B illustrate examples of a liquid immersion bath of the liquid immersion cooling apparatus.
Figure 6B:
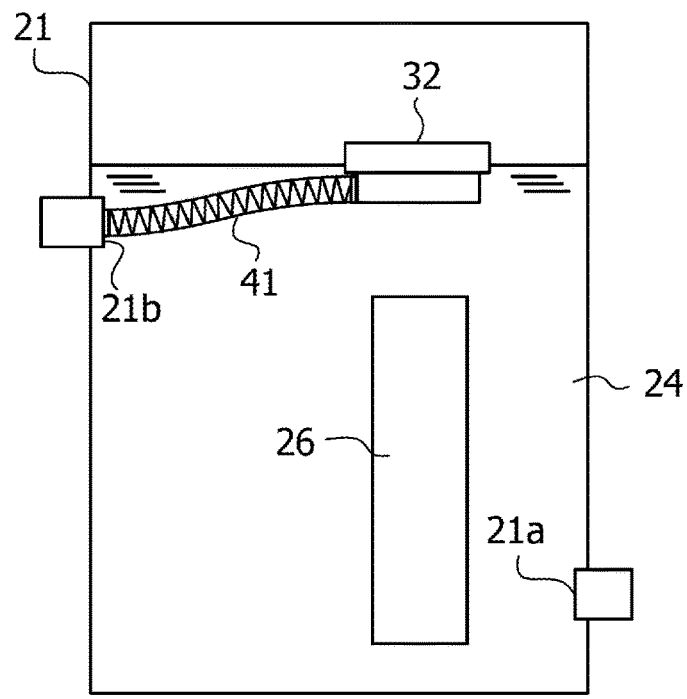

FIGS. 6A and 6B illustrate examples of the liquid immersion bath of the liquid immersion cooling apparatus. FIG. 6A illustrates a situation where the electronic device 26 is disposed at a position in the liquid immersion bath 21 relatively close to the coolant outlet 21b. FIG. 6B illustrates a situation where the electronic device 26 is disposed at a position relatively distant from the coolant outlet 21b.

The liquid immersion cooling apparatus in FIGS. 6A and 6B is different from that illustrated in FIG. 3 in that the hose connected between the coolant outlet 21b of the liquid immersion bath 21 and the coolant discharge port 32 is of a different kind. Other configurations in FIGS. 6A and 6B may be substantially the same as or similar to those illustrated in FIG. 3. For this reason, configurations of FIGS. 6A and 6B which are substantially the same as or similar to those illustrated in FIG. 3 may be assigned the same reference numerals, and their repeated descriptions may be omitted.

For example, an extendable and contractible bellows hose with flexibility may be used as a hose 41 to be connected between the coolant outlet 21b and the coolant discharge port 32.

If the electronic device 26 is disposed at a position relatively close to the coolant outlet 21b, the coolant discharge port 32 is disposed immediately above the electronic device 26 by contracting the hose 41, as illustrated in FIG. 6A.

If the electronic device 26 is disposed at a position relatively distant from the coolant outlet 21b, the coolant discharge port 32 is disposed immediately above the electronic device 26 by extending the hose 41, as illustrated in FIG. 6B.

For example, an extendable and contractible bellows hose with flexibility is used as the hose 41. Alternatively, it is possible to use in combination a hose with flexibility and an extendable and contractible pipe configured to extend and contract by sliding an inner pipe and an outer pipe relative to each other.

Figure 7A:
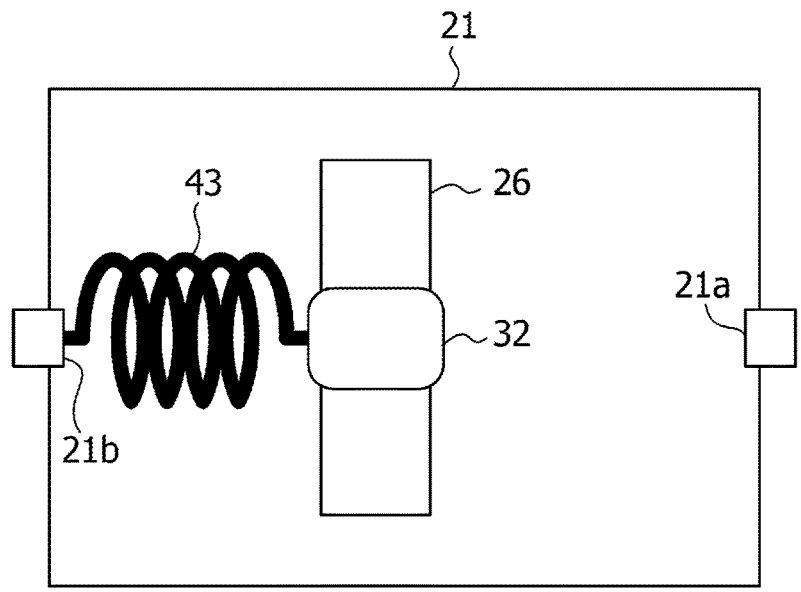
FIGS. 7A and 7B illustrate examples of the liquid immersion bath of the liquid immersion cooling apparatus.
Figure 7B:
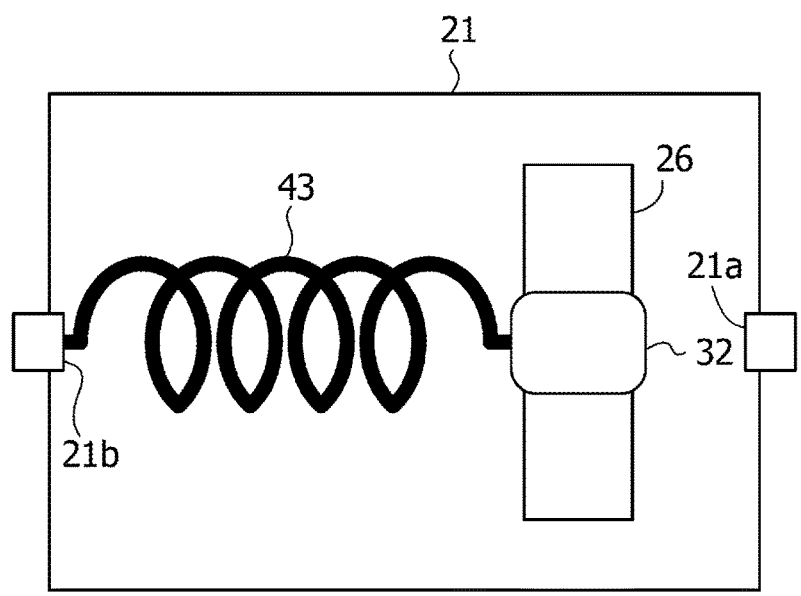

FIGS. 7A and 7B illustrate examples of the liquid immersion bath of the liquid immersion cooling apparatus. The liquid immersion cooling apparatus illustrated in FIGS. 7A and 7B may be a modification of the liquid immersion cooling apparatus illustrated in FIGS. 6A and 6B. FIG. 7A illustrates a plan view in a situation where the electronic device 26 is disposed at a position in the liquid immersion bath 21 relatively close to the coolant outlet 21b. FIG. 7B illustrates a plan view in a situation where the electronic device 26 is disposed at a position relatively distant from the coolant outlet 21b.

In the liquid immersion bath 21 illustrated in FIGS. 7A and 7B, a flexible hose capable of extending and contracting by virtue of its spirally curved shape is used as a hose 43 to be connected between the coolant outlet 21b and the coolant discharge port 32. The coolant discharge port 32 may be disposed immediately above the electronic device 26 by extending and contracting the spiral-shaped hose 43 depending on the position of the electronic device 26.

Figure 8:
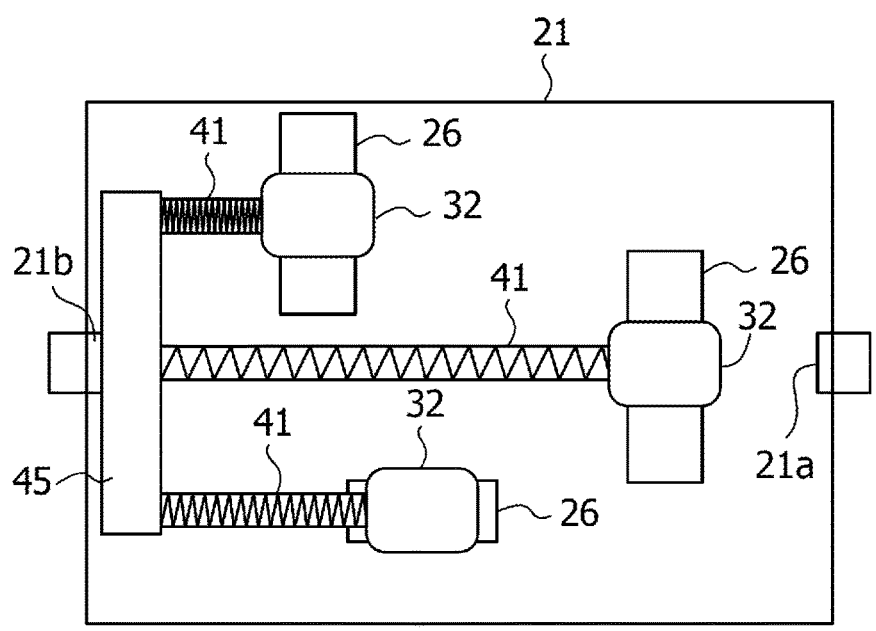
FIG. 8 illustrates an example of the liquid immersion cooling apparatus.

FIG. 8 illustrates an example of the liquid immersion cooling apparatus. FIG. 8 illustrates a situation where the liquid immersion bath is viewed from above. The liquid immersion cooling apparatus in FIG. 8 is different from that illustrated in FIGS. 6A and 6B in that more than one coolant discharge ports 32 are disposed in the liquid immersion bath. Other configurations in FIG. 8 may be substantially the same as or similar to those illustrated in FIGS. 6A and 6B. For this reason, configurations of FIG. 8 which are substantially the same as or similar to those illustrated in FIGS. 6A and 6B may be assigned the same reference numerals, and their repeated descriptions may be omitted.

For example, as illustrated in FIG. 8, more than one coolant discharge ports 32 (three in FIG. 8) float on the liquid surface of the liquid immersion bath 21. Each of these coolant discharge ports 32 includes the float 33a and the suction port part 33b (see FIG. 4).

A collecting pipe 45 is connected to the coolant outlet 21b of the liquid immersion bath 21. The hose 41 is connected between each coolant discharge port 32 and the collecting pipe 45. Each of the hoses 41 has flexibility and is capable of extending and contracting, as illustrated in FIGS. 6A and 6B.

As illustrated in FIG. 8, each coolant discharge port 32 is disposed immediately above the corresponding electronic device 26 by extending and contracting the hoses 41 depending on the positions of the electronic devices 26 disposed in the liquid immersion bath 21. For this reason, the coolant 24 warmed by the electronic devices 26 is efficiently transferred to the heat exchanger 23 (see FIG. 3). As a result, the efficiency of cooling each electronic device 26 may even further improve.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A liquid immersion bath comprising:
    a liquid immersion bath main body in which liquid coolant and an electronic device to be immersed in the coolant are placed;
    a coolant inlet and a coolant outlet provided to the liquid immersion bath main body;
    a coolant discharge port which floats on a liquid surface of the liquid coolant in the liquid immersion bath main body; and
    a hose which couples the coolant outlet and the coolant discharge port and bends in accordance with a movement of the coolant discharge port due to variation in a height of the liquid surface, the coolant discharge port includes a suction port part having a plurality of holes at a bottom surface of the suction port part and at one side surface of the suction port part and a float which is provided so as to be in contact with an upper surface of the suction port part at a bottom surface of the float, and the hose is coupled to the other side surface of the suction port part opposite to the one side surface of the suction port part.

2. The liquid immersion bath according to claim 1, wherein the suction port part is disposed under the float and corresponds to a suction port to suction the liquid coolant in the liquid immersion bath main body.

3. The liquid immersion bath according to claim 1, wherein the hose is a bellows hose.

4. The liquid immersion bath according to claim 1, wherein the hose is capable of extending and contracting.

5. The liquid immersion bath according to claim 1, wherein a plurality of coolant discharge ports are provided as the coolant discharge port and a plurality of hoses are provided as the hose.

6. The liquid immersion bath according to claim 5, wherein a plurality of coolant electronic devices are provided as the electronic device, the plurality of coolant discharge ports and the plurality of hoses are provided for the respective electronic devices and the plurality of hoses have a different degree of extending and contracting based on a position of the respective electronic devices.

7. The liquid immersion bath according to claim 1, wherein the coolant inlet is disposed at a lower portion of the liquid immersion bath main body, and the coolant outlet is disposed at an upper portion of the liquid immersion bath main body.

8. A liquid immersion cooling apparatus comprising:
a liquid immersion bath in which liquid coolant and an electronic device to be immersed in the coolant are placed;
a heat exchanger;
a pump which circulates the coolant between the liquid immersion bath and the heat exchanger;
a coolant discharge port which is disposed in the liquid immersion bath and which floats on a liquid surface of the liquid coolant; and
a hose which is coupled between a coolant outlet of the liquid immersion bath and the coolant discharge port and which bends when the coolant discharge port moves due to variation in a height of the liquid surface,
the coolant discharge port includes a suction port part having a plurality of holes at a bottom surface of the suction port part and at one side surface of the suction port part and a float which is provided so as to be in contact with an upper surface of the suction port part at a bottom surface of the float, and the hose is coupled to the other side surface of the suction port part opposite to the one side surface of the suction port part.

9. The liquid immersion cooling apparatus according to claim 8, wherein the suction port part is disposed under the float and corresponds to a suction port to suction the liquid coolant in the liquid immersion bath main body.

10. The liquid immersion cooling apparatus according to claim 8, wherein the hose is a bellows hose.

11. The liquid immersion cooling apparatus according to claim 8, wherein the hose is capable of extending and contracting.

12. The liquid immersion cooling apparatus according to claim 8, wherein a plurality of coolant discharge ports are provided as the coolant discharge port and a plurality of hoses are provided as the hose.

13. The liquid immersion cooling apparatus according to claim 12, wherein a plurality of coolant electronic devices are provided as the electronic device, the plurality of coolant discharge ports and the plurality of hoses are provided for the respective electronic devices and the plurality of hoses have a different degree of extending and contracting based on a position of the respective electronic devices.

14. The liquid immersion cooling apparatus according to claim 8, wherein the coolant inlet is disposed at a lower portion of the liquid immersion bath main body, and the coolant outlet is disposed at an upper portion of the liquid immersion bath main body.

* * * * *